United States Patent

Booher

[15] 3,678,290

[45] July 18, 1972

[54] RATIOLESS AND NON-INVERTING LOGIC CIRCUIT USING FIELD EFFECT BOOSTING DEVICES

[72] Inventor: Robert X. Booher, Mission Viejo, Calif.

[73] Assignee: North American Rockwell Corporation

[22] Filed: May 23, 1969

[21] Appl. No.: 827,269

[52] U.S. Cl. ........................... 307/205, 307/208, 307/221 C

[51] Int. Cl. ........................... H03k 19/08

[58] Field of Search .................. 307/205, 251, 279, 304, 208, 307/221 C

[56] References Cited

UNITED STATES PATENTS 3,506,851 4/1970 Polkinghorn et al ................... 307/251

OTHER PUBLICATIONS

Electronic Design News, June 10, 1968, " Multiphase Clocking" by Boysel et al.

General Instrument Corp., Dec. 1967, " MTOS Shift Registers" by Sidorsky

*Primary Examiner*—John S. Heyman

*Attorney*—William R. Lane, L. Lee Humphries and Robert G. Rogers

[57] ABSTRACT

A non-inverting logic gate using a field effect device which includes a boosting capacitor having a fixed plate connected to an input terminal and its other plate comprising an inverted layer in the substrate region under the fixed plate. The inverted layer is formed in response to an input signal. A clocked terminal is connected to the inverted layer. As a result, the voltage on the fixed plate is boosted by the voltage level on the electrode. The fixed plate is connected to the gate electrode of a field effect transistor having its source electrode connected to the clocked terminal and its drain electrode connected to an output terminal. An isolation field effect transistor is connected between the output terminal and the field effect transistor for isolating the output terminal after it has been set to the voltage level equivalent to the input voltage level. Initially, the output is set to one voltage level which is changed as a function of the input voltage.

5 Claims, 3 Drawing Figures

INVENTOR.
ROBERT K. BOOHER

BY

ATTORNEY

INVENTOR.
ROBERT K. BOOHER
BY
Robert G. Rogers
ATTORNEY

RATIOLESS AND NON-INVERTING LOGIC CIRCUIT USING FIELD EFFECT BOOSTING DEVICES

BACKGROUND OF THE INVENTION

1. Field of the Invention

The invention relates to a ratioless and non-inverting logic circuit using field effect boosting devices for implementing a shift register in which each half stage comprises a ratioless and non-inverting logic circuit using a field effect boosting device, and for implementing other logic circuits.

2. Description of Prior Art

A multiphase gating system for implementing a multiphase shift register is described and shown in Ser. No. 523,767, filed Jan. 28, 1966, inventor Robert K. Booher, entitled MULTIPLE PHASE GATING SYSTEM. The system uses field effect transistors as gating devices and the input of each half stage is inverted at the output of each half stage. In addition, the output voltage at each half stage may be reduced by the threshold loss incurred when unconditionally setting the output to a voltage level during one interval of the operation of the gating system.

Subsequent to the development of the above system, a field effect conditionally switched capacitor was invented. The capacitor is described in a patent application entitled FIELD EFFECT CONDITIONALLY SWITCHED CAPACITOR, filed on Mar. 4, 1969, by Robert K. Booher and Robert W. Polkinghorn. That device can be used with field effect transistors to boost the voltage applied to a control electrode of a field effect device. As a result of boosting the voltage on the control electrode, the field effect device can be driven so that the voltage on its output electrode is equal to the voltage applied to its other electrode.

It would be advantageous to implement a ratioless shift register using the conditionally switched capacitor to overcome the threshold losses and to provide a non-inverted output voltage at each half stage. The present invention provides such a register.

SUMMARY OF THE INVENTION

Briefly, the invention comprises a ratioless shift register implemented by a field effect transistor device including a switchable capacitor connected between the input to each half stage and a clock source for boosting the control voltage of the field effect device when the input voltage represents a certain logic state. For example, when the input is true, i.e., a logic 1, the output voltage from the field effect transistor is driven to a level which equals the true level of the input signal without an inversion.

Another field effect transistor is used to unconditionally set the output to a voltage level prior to the evaluation of the input voltage level. It is during the evaluation interval that the output voltage is driven to an increased voltage as a function of the input voltage level. If the input voltage level is false, the output voltage is not increased. For example, the output voltage level may initially be set to a ground voltage level to represent a logic zero. If the input is also a logic 0, then the output will remain unchanged. On the other hand, if the input is a logic 1, the output will be set to a voltage level representing a logic 1.

The invention may also be used as a single ratioless and non-inverting logic circuit using a field effect device for boosting an input control voltage. As a result of boosting the input control voltage, a non-inverted output is obtained. In other embodiments, various combinations of field effect devices may be used to implement various logic configurations in a two terminal logical network. For example, a plurality of field effect devices may be connected in parallel to implement a non-inverting OR function.

Therefore, it is an object of this invention to provide a ratioless and non-inverting logic circuit using a field effect boosting device.

It is another object of this invention to provide an improved ratioless shift register.

It is another object of this invention to provide a ratioless shift register in which no inversion occurs between the input and output of each half stage.

It is another object of this invention to provide a ratioless shift register which uses a field effect conditionally switched capacitor for overcoming threshold losses.

A still further object of the invention is to provide a ratioless shift register using a field effect conditionally switched capacitor for driving the output voltage to a boosted input voltage level.

These and other objects of the invention will become more apparent when taken in connection with the following description of invention, a brief description of which follows:

DESCRIPTION OF PREFERRED EMBODIMENT

Figure 1:
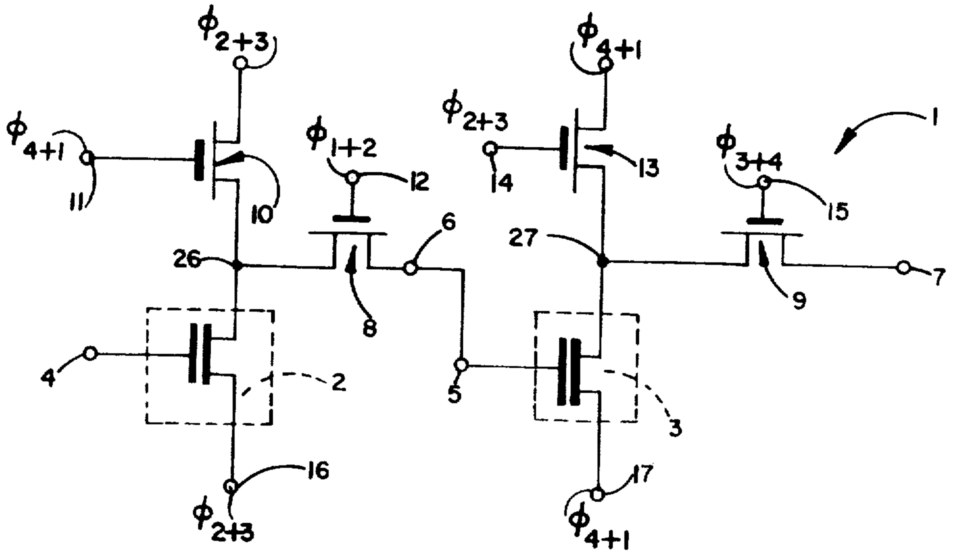
FIG. 1 is a schematic representation of a portion of a ratioless shift register using field effect conditionally switched capacitors.

FIG. 1 illustrates two half stages, one bit position, of a non-inverting and ratioless shift register 1. The first half stage includes field effect device 2 which is connected through field effect device 8 to output terminal 6. The second half stage includes field effect device 3 connected between its input terminal 5 through field effect transistor 9 to output terminal 7. It is pointed out that the output terminal 6 for the first half stage is connected to input terminal 5 of the second half stage to implement one stage of a shift register. It is pointed out that additional stages can be added as required to implement a shift register having any number of stages.

The field effect transistors 8 and 9 are used in the register to prevent the occurrence of a race condition which might otherwise render the shift register inoperative. The devices provide isolation for the output terminals as described subsequently.

Field effect transistor 10 is connected between device 8 and clock source $\phi_{2+3}$. The field effect transistor has a control electrode 11 connected to clock source $\phi_{4+1}$. Control electrode 12 of field effect device 8 is connected to clock source $\phi_{1+2}$.

Similarly, field effect transistor 13 is connected between field effect transistor 9 and clock source $\phi_{4+1}$. The field effect transistor has a control electrode 14 which is connected to clock source $\phi_{2+3}$. Field effect transistor 9 has a control electrode connected to clock source $\phi_{3+4}$.

Clock sources $\phi_{2+3}$ and $\phi_{4+1}$ are connected to electrodes 16 and 17 of devices 2 and 3. The function of the clock $\phi_{2+3}$ and $\phi_{4+1}$ will become more apparent in connection with the description of the operation.

Figure 2:
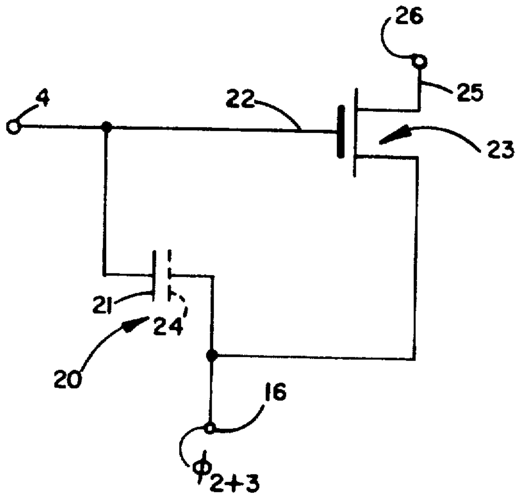
FIG. 2 is a schematic illustration of the combination of a field effect conditionally switched capacitor and a field effect transistor implementing a portion of the FIG. 1 shift register.

FIG. 2 is a schematic illustration of device 2 shown in FIG. 1. It should be understood that device 3 is similarly implemented. As shown in FIG. 2, device 2 comprises conditionally switched capacitor 20 having its fixed plate 21 connected to control electrode 22 of MOS device 23. Capacitor 20 also comprises plate 24 which is conditionally connected to electrode 16 as a function of the voltage level on input terminal 4. The manner in which the capacitance of capacitor 20 is switched between a reference potential such as the potential of the substrate (shown as part of the dashed line) and an input electrode is described in more detail in the referenced application entitled FIELD EFFECT CONDITIONALLY SWITCHED CAPACITOR.

Electrode 25 of field effect device 23 is connected to a common point 26 between MOS device 8 and MOS device 10.

It should be pointed out that although half stages of the FIG. 1 shift register are implemented by the devices 2 and 3, for other logic circuits more complex configurations may be used. Stated alternatively, device 2 comprises a two terminal network having terminals 16 and 26. The network is implemented by a single field effect transistor and conditionally switched capacitor.

Figure 3:
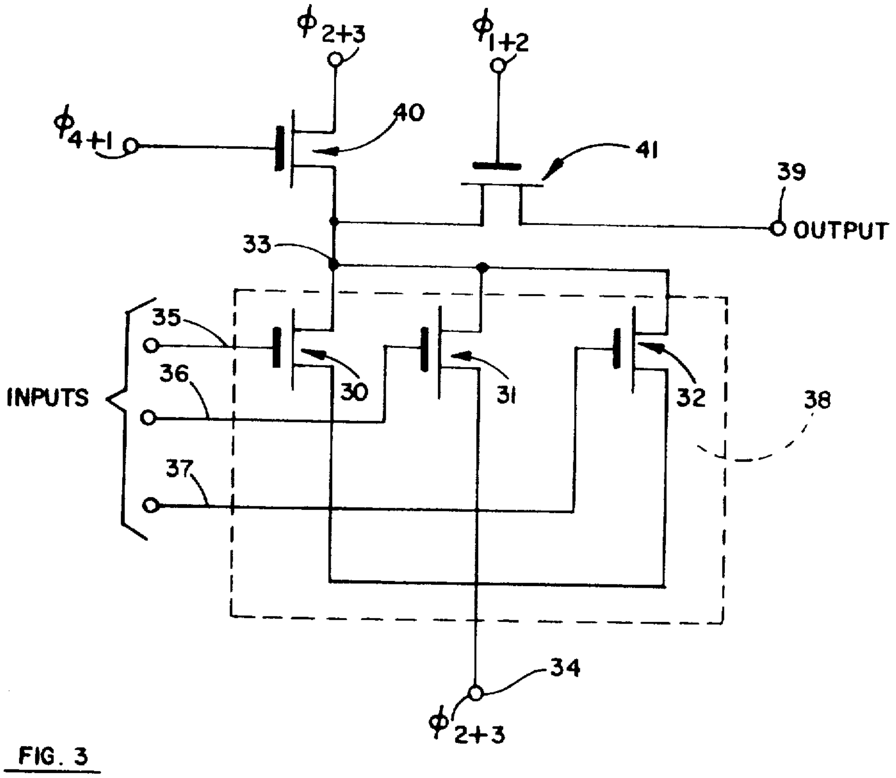
FIG. 3 is a schematic illustration of a ratioless and non-inverting logic circuit using a plurality of field effect boosting devices for implementing a two terminal logic network.

In other configurations, as shown generally in FIG. 3, a plurality of such devices 30, 31, and 32 may be connected in parallel between two terminals 33 and 34 for implementing a non-inverting OR logic function. As shown, each of the inputs 35, 36 and 37 may receive a signal independently of each other input so that any of the devices comprising the logic network 38 may be used to provide the non-inverted output at output 39. Devices 40 and 41 provide the same function as similar devices described in connection with FIG. 1. It should be obvious that other devices may be connected to implement different logic functions than the OR function shown. The OR function is given as one example of a complex logic function.

In operation, it is assumed that the voltage level on input terminal 4 is stabilized and isolated from other stages during $\phi_1$ and $\phi_2$ times, i.e. during the period that the clock $\phi_{1+2}$ is true. At $\phi_1$, MOS device 10 is turned on and common point 26 is connected to ground. Clock $\phi_{2+3}$ is at a ground level during $\phi_1$ time. In addition, output terminal 6 of the first stage is also connected to ground through MOS device 8. At $\phi_2$, if the voltage level on the input terminal is sufficiently negative to represent a logic one state and is sufficiently negative to be at least equal to the threshold voltage of the switchable capacitor 20, the voltage on the control electrode of MOS device 23 is boosted by an amount proportional to the voltage of the clock $\phi_{2+3}$. As a result, the common point 26 and the output terminal are driven at least to the original input voltage level.

During $\phi_2$ time, if the input 4 is connected to a ground voltage level, i.e. logic 0, it is not boosted; and the output terminal remains at a ground voltage level. At $\phi_3$ and $\phi_4$, the output terminal 6 for the first half stage is isolated, since device 8 is turned off, so that the voltage level at output 6 can be used at the input 5 of the second half stage. In addition, during $\phi_3$ time, the output terminal 7 of the second half stage and the common point 27 between MOS device 9 and MOS device 13 are connected to zero voltage level. In other words, $\phi_{4+1}$ is at ground during $\phi_3$ time.

At $\phi_4$ time, if the input terminal 5 is at least greater than the threshold of the switchable capacitor comprising part of device 2, the voltage is boosted by an amount proportional to the clock signal $\phi_{4+1}$. The common point 27 and the output terminal 7 are driven at least to the original negative voltage level of the input terminal 5.

At $\phi_4$ time, if the input terminal had been a zero voltage level, the capacitance of the switchable capacitor would remain connected to ground, i.e. disconnected from the clock $\phi_{4+1}$At $\phi_{1+2}$, the output terminal 7 of the second half stage is isolated, since device 9 is turned off, and the voltage level can be used as an input to subsequent stages.

It should be obvious from the above description that the register operates in a ratioless manner and that it does not require steady state current. It is pointed out that if a negative voltage level existed on input terminal 4 of the first half stage during $\phi_2$ time of the first cycle, that voltage level in effect would have been shifted through both half stages to the output terminal 7 of the second half stage during $\phi_4$ time and would remain throughout the next $\phi_2$ time to drive succeeding stages. One cycle consists of the true intervals of the clock signals $\phi_{1+2}\phi_{2+3}$, $\phi_{3+4}$, and $\phi_{4+1}$. It should be understood that the clock signals have true or negative levels which overlap. For example, $\phi_{1+2}$ and $\phi_{2+3}$ both are true during the $\phi_2$ time.

I claim:

1. A ratioless and non-inverting logic circuit in a semiconductor substrate comprising, an output, a field effect transistor connected to said output for unconditionally setting the output to a first voltage during a first interval of time, a logic network having first and second terminals comprising one or more field effect devices each having control electrodes connected to independent input terminals, the input signals on the input terminals determining the impedance of the networks between said first and second terminals, and each having an electrode connected at a common point to said first terminal, said first terminal being connected to a clock signal terminal, the second of said terminals being connected to said output, each of said field effect devices including capacitor means having a fixed plate connected to the control electrode of the associated field effect device and an inverted layer in the substrate region subjacent said fixed plate forming a second plate of said capacitor means, said layer being inverted by the voltage level of a signal on the input terminal of the associated field effect device, said inverted layer being connected to the clock signal terminal for boosting the voltage on the control electrode of the associated field effect device by an amount proportional to the clock signal during a second interval of time, each of said field effect devices being responsive to the boosted control voltage on their respective control electrodes for driving the output of said circuit to a voltage level at least equal to the voltage level of said clock signal when an electrical path exists between said logic network signals.

2. The combination recited in claim 1 wherein more than one field effect devices are connected in electrical parallel for implementing a logic OR function.

3. A ratioless shift register comprising, a first half shift register stage having an output terminal and including field effect transistor means for unconditionally setting the output of said half stage to a first voltage level during a first interval of time, and a second field effect transistor means having a control electrode connected to an input terminal, and having an electrode connected to a clock signal terminal, said second means including capacitor means having a fixed plate connected to the input terminal and an inverted layer in a substrate region subjacent said fixed plate, said region being inverted for forming a second plate of said capacitor means by a voltage level appearing on said input terminal, said inverted layer being connected to said clock signal terminal for boosting the voltage on said control electrode by an amount proportional to the clock signal during a second interval of time, said second transistor means being responsive to said boosted control voltage for driving the output terminal of said first half stage to a voltage level equivalent to the original voltage level on the input terminal, a third field effect transistor means for isolating said output terminal at least during a third interval of time.

4. The combination recited in claim 3 including a second half stage of said shift register comprising a first field effect transistor means for unconditionally setting the output terminal of the second half stage to a first voltage level during said third terminal of time, and a second field effect transistor means including capacitor means having a fixed plate connected to the input terminal of the second half stage and an inversion layer subjacent said fixed plate in a substrate for forming the second plate of said capacitor means, said output terminal of the first half stage and the input terminal of the second half stage being connected, said inversion layer being formed by a voltage level appearing on the input terminal for connecting said inversion layer to a second clock source for boosting the voltage at the output terminal of the second half stage to at least the amount equivalent to the original voltage level on the input terminal during a fourth interval of time, field effect transistor means for isolating said output terminal of the second half stage during an interval of time following said fourth interval of time.

5. A ratioless shift register comprised of field effect devices at least partially formed in a substrate, said shift register comprising a plurality of stages and including, a first half stage having a first transistor means for setting an output terminal to a first voltage level during a first interval of time, a second field effect device including a capacitor means having a fixed plate connected to a first input terminal and having a control electrode connected to said input terminal, and a switchable plate comprising an inversion layer in the substrate region subjacent said fixed plate, said inversion layer being electrically connected to a first clock source for conditionally switching the capacitance of said capacitor to said clock source as a function of the voltage level on the input terminal for boosting the voltage level on the control electrode of the second field effect transistor means, said second means being responsive during a second interval of time to said boosted voltage for boosting the voltage of said output terminal to a voltage level at least equal to the original voltage level on the input terminal, means for isolating said output terminal during a third interval of time.

* * * * *